United States Patent
Kuo et al.

(10) Patent No.: US 9,621,181 B2
(45) Date of Patent: Apr. 11, 2017

(54) DIGITAL TO ANALOG CONVERTER WITH OUTPUT IMPEDANCE COMPENSATION

(71) Applicant: NATIONAL CHENG KUNG UNIVERSITY, Tainan (TW)

(72) Inventors: Tai-Haur Kuo, Tainan (TW); Hung-Yi Huang, Tainan (TW); Wei-Cheng Hong, Kaohsiung (TW)

(73) Assignee: National Cheng Kung University (TW)

( * ) Notice: Subject to any disclaimer, the term of this patent is extended or adjusted under 35 U.S.C. 154(b) by 0 days.

(21) Appl. No.: 14/676,227

(22) Filed: Apr. 1, 2015

(65) Prior Publication Data

US 2017/0041018 A1 Feb. 9, 2017

(51) Int. Cl.
  *H03M 1/06* (2006.01)
  *H03M 1/80* (2006.01)
  *H03M 1/66* (2006.01)

(52) U.S. Cl.
  CPC ......... *H03M 1/808* (2013.01); *H03M 1/0602* (2013.01); *H03M 1/664* (2013.01)

(58) Field of Classification Search
  CPC ........ H03M 1/66; H03M 1/747; H03M 3/358; H03M 3/50
  USPC .......................................... 341/118, 120, 144
  See application file for complete search history.

(56) References Cited

U.S. PATENT DOCUMENTS

| | | | | |
|---|---|---|---|---|
| 4,751,497 A | * | 6/1988 | Torii | H03M 1/0881 341/154 |
| 6,191,719 B1 | * | 2/2001 | Bult | H03M 1/0624 341/144 |
| 7,468,686 B2 | * | 12/2008 | Brubaker | H03M 1/1061 341/121 |
| 8,183,885 B2 | * | 5/2012 | Aziz | H03K 19/017581 326/83 |
| 8,643,520 B1 | * | 2/2014 | Huo | H03M 1/068 341/136 |
| 8,674,867 B1 | * | 3/2014 | Klepser | H01F 21/12 341/144 |
| 2006/0033651 A1 | * | 2/2006 | Guyot | H03M 1/0604 341/144 |
| 2007/0194967 A1 | * | 8/2007 | Huang | H04L 25/0278 341/154 |
| 2013/0106634 A1 | * | 5/2013 | Savoj | G06K 7/10237 341/144 |
| 2015/0244384 A1 | * | 8/2015 | Teterwak | H03M 1/0624 341/144 |

* cited by examiner

*Primary Examiner* — Linh Nguyen
(74) *Attorney, Agent, or Firm* — Kolisch Hartwell, P.C.

(57) ABSTRACT

A digital to analog converter with output impedance compensation has an encoding unit, a current cell array, a summing unit and a compensation unit. The compensation unit is connected to output terminals of the DAC and provides a nonlinear impedance to compensate an original output impedance of the DAC. With the compensated output impedance, the SFDR performance and the linearity of the DAC are improved to obtain a superior input-to-output transfer curve.

13 Claims, 13 Drawing Sheets

DIGITAL TO ANALOG CONVERTER WITH OUTPUT IMPEDANCE COMPENSATION

BACKGROUND OF THE INVENTION

Field of the Invention

The present invention relates to a digital to analog converter (DAC), and more particularly to a digital to analog converter with output impedance compensation for enhancing performance of digital to analog conversion.

Description of the Prior Art

Figure 13:
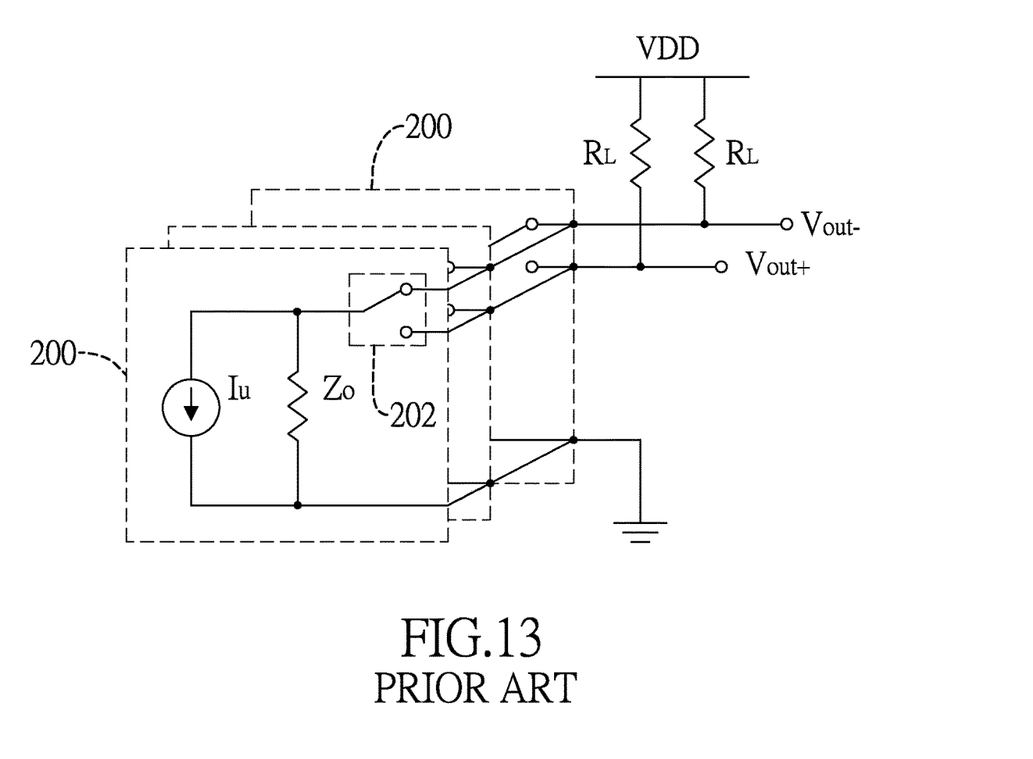
FIG. 13 shows a current cell array of a conventional N-bit current-steering DAC.

With reference to FIG. 13, a multi-bit current-steering digital-to-analog converter (DAC) is composed of multiple current cells 200. Each of the current cells 200 includes a current source $I_u$ with an output impedance $Z_o$ of the current cell 200 in parallel and a pair of current switches, wherein the pair of current switches is simplified as a single switching element 202 with two output ends in FIG. 13. Ideally, the output impedance $Z_o$ of the current cell 200 should be infinitely large, so the current from the current source $I_u$ can fully flow to an output load $R_L$ instead of flowing to the output impedance $Z_o$. However, the output impedance of any practical device is finite. As a result, the output current of the current source $I_u$ does not fully flow to the output load $R_L$, causing some non-ideal effects.

For a single current cell 200, the finite output impedance $Z_o$ will only cause gain error rather than nonlinear distortion if the value of the output impedance $Z_o$ is constant. However, the number of all the current cells 200 in the multi-bit current-steering DAC is much more than one. For an N-bit current-steering DAC, there are $2^N-1$ current cells 200. All of the current cells 200 are connected in parallel to sum their output currents at two output terminals $V_{out+}$, $V_{out-}$ of the DAC.

Figure 14:
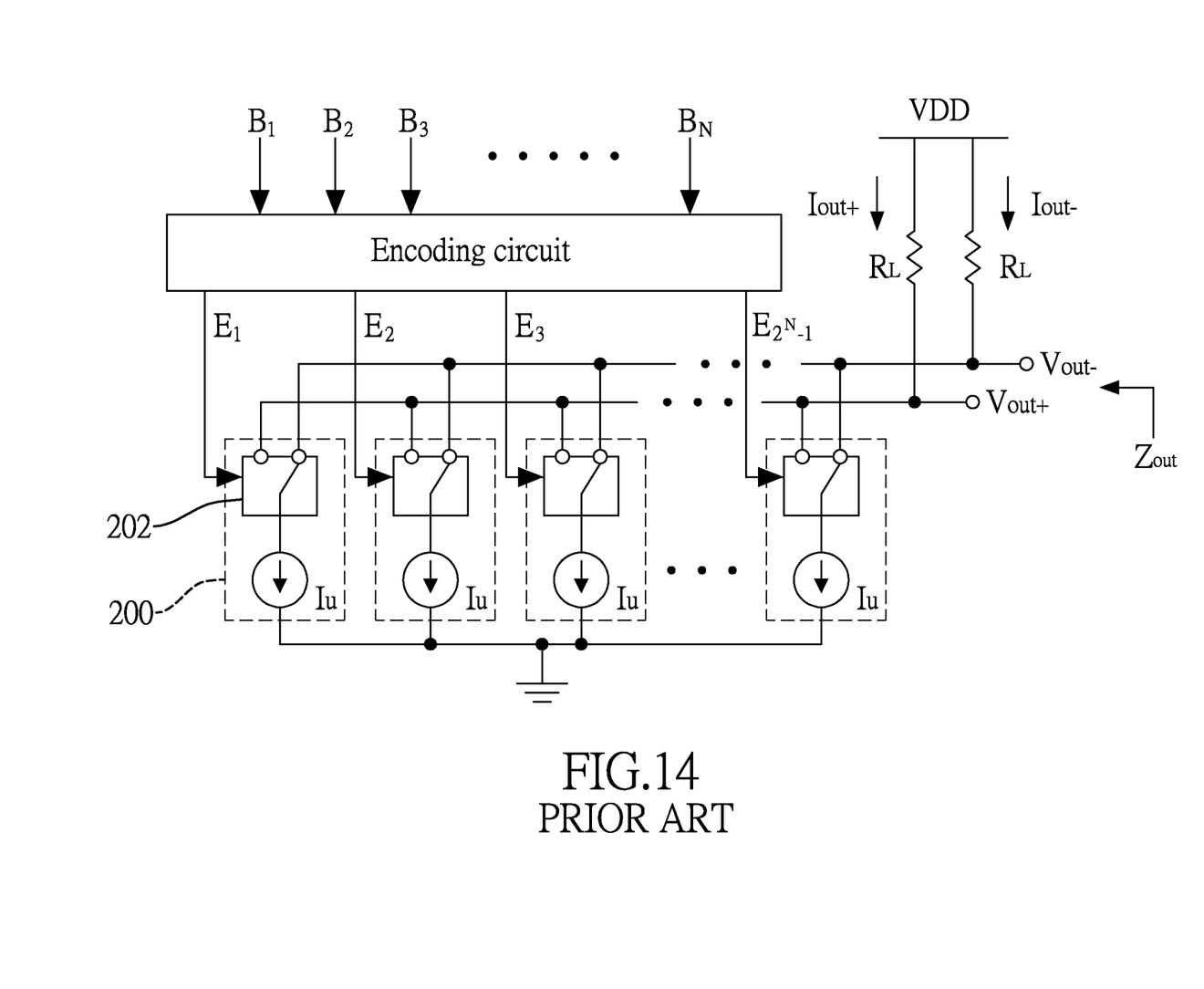
FIG. 14 shows an architecture of the conventional N-bit current-steering DAC.

With reference to FIG. 14, considering an N-bit current-steering DAC, there are $2^N-1$ current cells 200 connected in parallel at the output terminals of the DAC. An overall output impedance $Z_{out}$ seen from the output terminals $V_{out+}$, $V_{out-}$ of the DAC is correlated to the number of the current cells 200 connected at the output terminals $V_{out+}$, $V_{out-}$. The connection of each current cell 200 to any one of the output terminals $V_{out+}$, $V_{out-}$ is determined by its respective current switch, which is controlled by digital input signals $B_1$, $B_2$ . . . $B_N$. As a result, the overall output impedance $Z_{out}$ is nonlinear and varies with the digital input signals $B_1$, $B_2$ . . . $B_N$. The nonlinear overall output impedance $Z_{out}$ will cause harmonic distortion tones in frequency domain.

In addition to the input signals-dependent nonlinearity, the output impedance $Z_o$ of each current cell 200 is also affected by an output voltage at the output terminals $V_{out+}$, $V_{out-}$. The output voltage dependency of the output impedance further degrades the linearity of the DAC.

SUMMARY OF THE INVENTION

An objective of the present invention is to provide a digital to analog converter (DAC) with output impedance compensation, wherein the linearity and the spurious free dynamic range (SFDR) performance of the DAC can be improved.

The DAC comprises an encoding unit, a current cell array, a summing unit and a compensation unit. The encoding unit receives and encodes a plurality of binary-weighted digital inputs to generate a plurality of encoded controlling signals. The current cell array comprises a plurality of conversion units that respectively receive the encoded controlling signals to generate analog output signals. The summing unit receives the analog output signals from the current cell array and sums the analog output signals to generate an accumulated analog output signal. The compensation unit provides a nonlinear impedance to compensate an output impedance seen from the current cell array and the summing unit of the DAC.

By incorporating the compensation unit in the DAC, the output impedance is compensated and improved. As a result, the linearity of an input-to-output transfer curve of the DAC is improved, and the SFDR performance of the DAC can also be enhanced.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
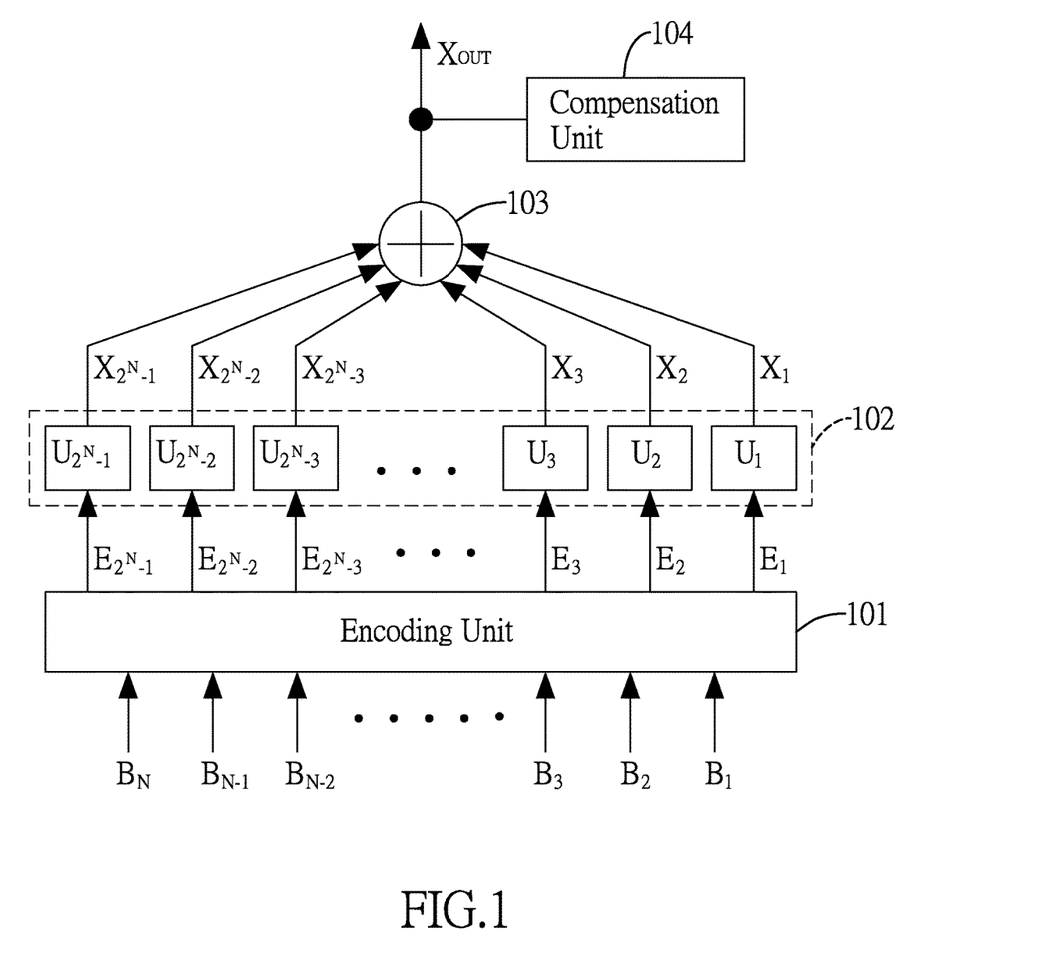
FIG. 1 shows an N-bit digital to analog converter (DAC) of the present invention.

With reference to FIG. 1, an N-bit digital to analog converter (DAC) according to the present invention comprises an encoding unit 101, a current cell array 102 comprised of multiple current cells $U_i$, where i is from $2^N-1$ to 1, a summing unit 103 and a compensation unit 104, wherein each current cell $U_i$, is a conversion unit.

The encoding unit 101 receives a plurality of binary-weighted digital inputs $B_N$ to $B_1$. The encoding unit 101 generates a plurality of encoded controlling signals $E_i$, where i is from $2^N-1$ to 1, based on the received binary-weighted digital inputs $B_N$ to $B_1$ for the current cells $U_i$ respectively. The encoded controlling signals $E_i$ may be thermometer-coded signals, direct binary-coded signals, or the combination of the both. The current cells $U_i$ respectively receive the encoded controlling signals $E_i$ and generate respective analog output signals $X_i$ where i is from $2^N-1$ to 1. The summing unit 103 receives the analog output signals $X_i$ from all of the current cells $U_i$ and generates an accumulated analog output signal $X_{OUT}$. The compensation unit 104 is provided to compensate an output impedance seen from outputs of the summing unit 103 and the current cell array 102.

The DAC may have two differential output terminals or a single-end output terminal. In one embodiment, the compensation unit 104 comprises two separated compensation circuits connected to the differential output terminals of the DAC respectively. In another embodiment, the compensation unit 104 is a single compensation circuit connected between the differential terminals. In yet another embodiment, the compensation unit 104 is a single compensation circuit connected to the single-end output terminal.

Figure 2:
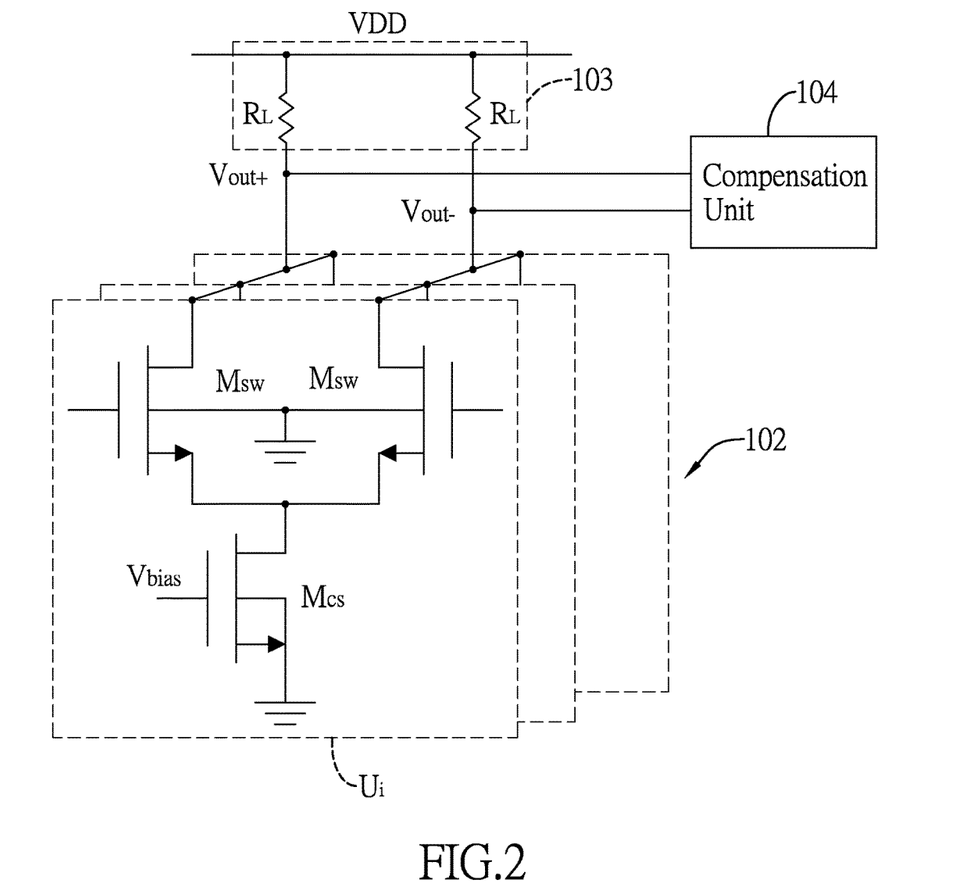
FIG. 2 shows a current cell array comprised of multiple conversion units of the DAC of FIG. 1.

With reference to FIG. 2, for an N-bit current-steering DAC, a number of the current cells $U_i$ of the N-bit DAC is $2^N-1$. In this embodiment, the DAC has differential output terminals $V_{out+}$, $V_{out-}$ at which the current cell array 102 and the summing unit 103 are connected together. All of the current cells $U_i$ are connected to the differential output terminals $V_{out+}$, $V_{out-}$. Each current cell $U_i$ comprises a current source $M_{CS}$, and a pair of current switches $M_{SW}$. The current switches $M_{SW}$ direct an output current of each current cell $U_i$ to one of the differential output terminals $V_{out+}$, $V_{out-}$. The compensation unit 104 provides a nonlinear compensating impedance $Z_C$ between the differential output terminals $V_{out+}$, $V_{out-}$ of the DAC.

Figure 3:
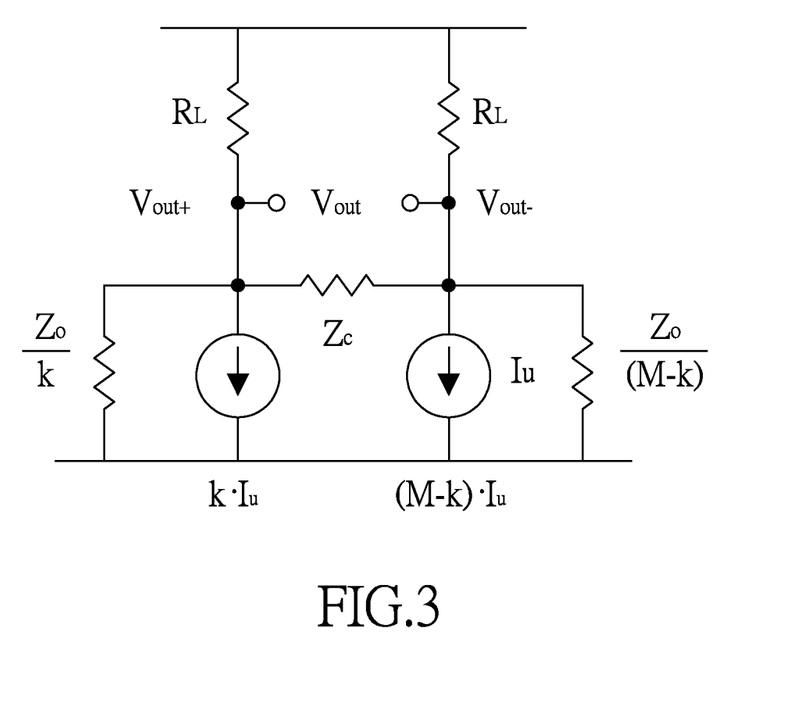
FIG. 3 shows a simplified impedance model of the current cell array connected with an impedance model $Z_C$ of a compensation circuit.

With reference to FIG. 3, a simplified impedance model of the current cell array 102 with an impedance model of the compensation unit 104 is shown. By providing the nonlinear compensating impedance $Z_C$ between the differential output terminals of the DAC, the original nonlinear output impedance of the DAC is compensated. With the compensated output impedance, the linearity of the DAC's output signal can be increased. Therefore, the spurious free dynamic range (SFDR) performance of the DAC will be improved. The nonlinear compensating impedance $Z_C$ can be designed to be simple or complex according to the desired performance and implementation complexity.

In the impedance model of FIG. 3, M is the number of total current cells $U_i$, i.e. $M=2^N-1$, k is the decimal value of the received binary-weighted digital inputs $B_N$ to $B_1$, and $R_L$ is a loading resistor. Each current cell $U_i$ is modeled as an output impedance $Z_o$ connected in parallel with an ideal current source providing an output current $I_u$. The output current of each current cell flows to one of the differential output terminals $V_{out+}$, $V_{out-}$ under the control of the current switches. Since the current cells $U_i$ are connected at the differential output terminals $V_{out+}$, $V_{out-}$, all of the output impedances of the current cells $U_i$ are connected in parallel and can be denoted by $Z_o/k$ and $Z_o/(M-k)$. Therefore, the total output impedances of the DAC seen from the output terminals vary with the input signal.

Figure 4:
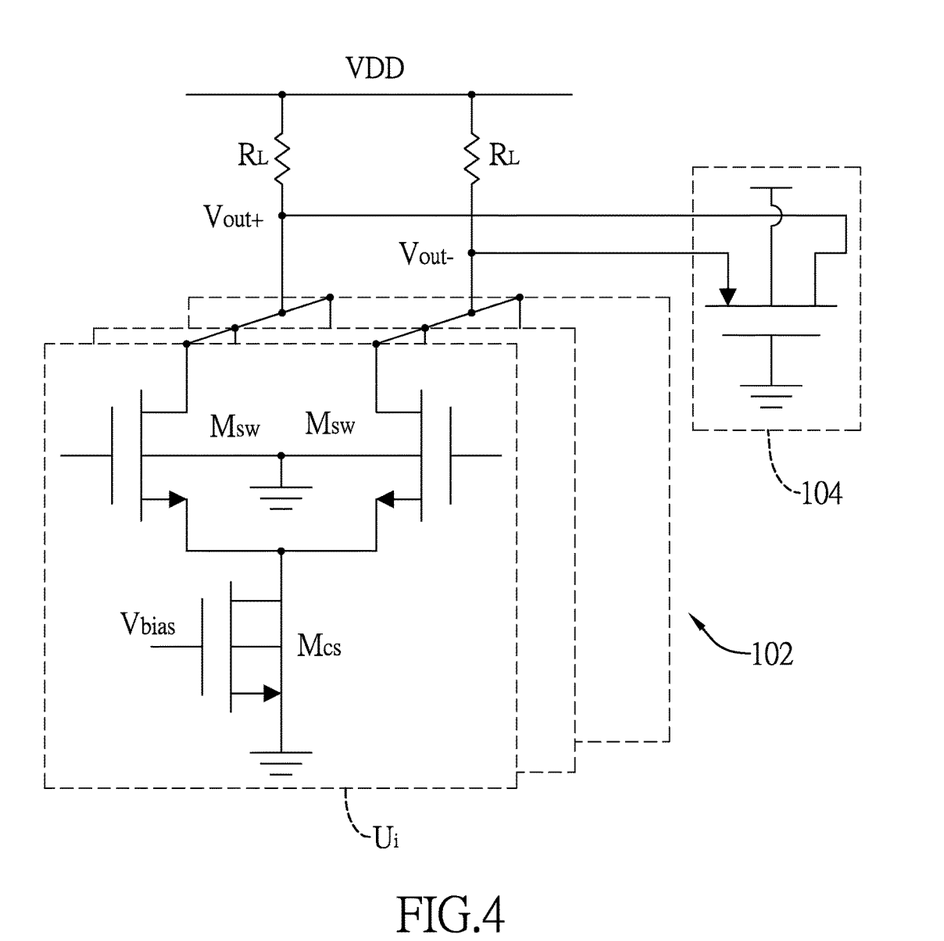
FIG. 4 is a circuit diagram showing the current cell array connected to the compensation unit implemented by a single PMOS transistor of the present invention.
Figure 5:
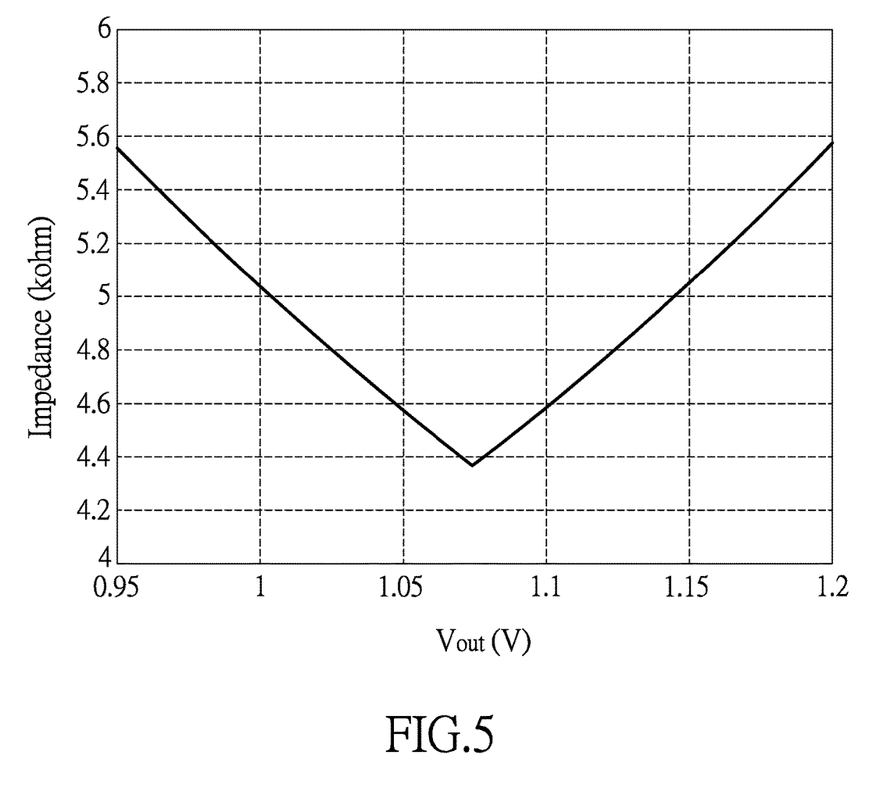
FIG. 5 shows an impedance curve of the PMOS transistor of FIG. 4.

With reference to FIG. 4, the compensation unit 104 in accordance with a first embodiment is implemented by a P-type metal-oxide-semiconductor (PMOS) transistor operated in a linear region and having a source, a drain and a gate. The drain and the source of the PMOS transistor are respectively connected to the differential output terminals $V_{out+}$, $V_{out-}$, and the gate is grounded. With reference to FIG. 5, due to the non-ideal effects of the PMOS transistor and the symmetric voltages at the differential output terminals $V_{out+}$, $V_{out-}$ of the DAC, the impedance curve of the PMOS is symmetrically v-shaped. The Y-axis represents the impedance value and the X-axis represents an output voltage of one of the differential output terminals $V_{out+}$, $V_{out-}$.

Figure 6:
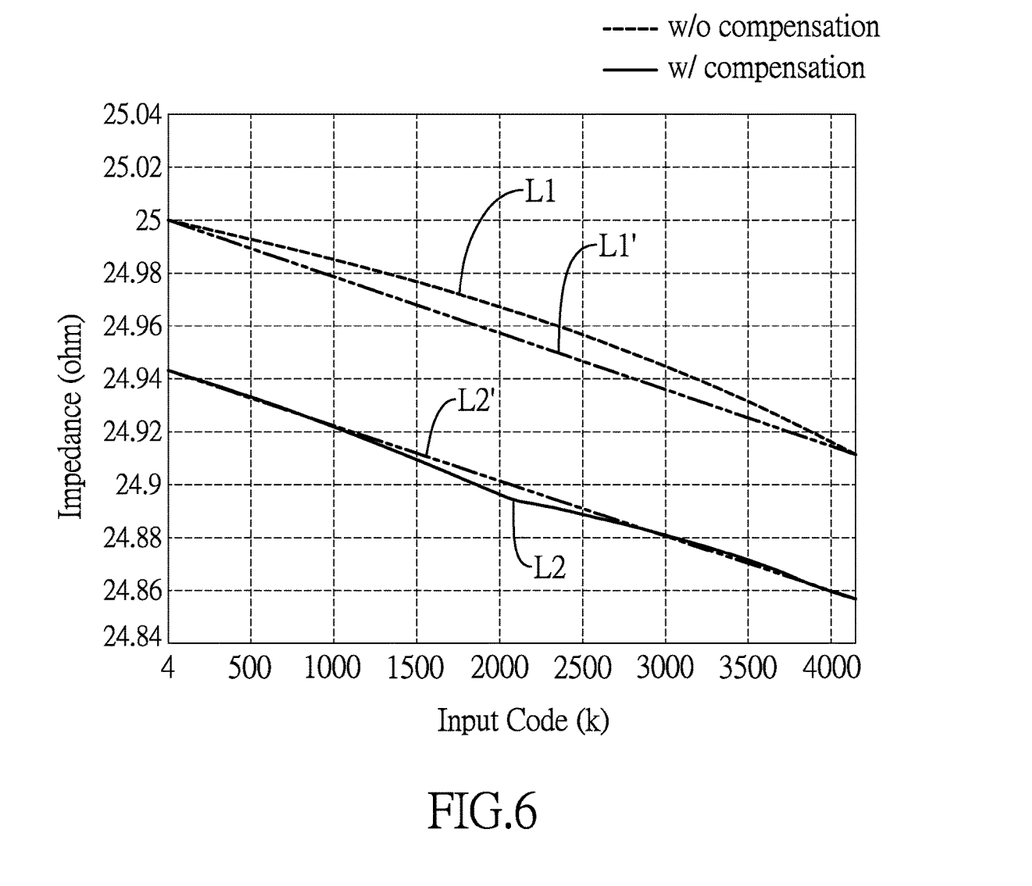
FIG. 6 shows output impedance curves of a 12-bit exemplary DAC without and with output impedance compensation.

With reference to FIG. 6, two output impedance curves of a 12-bit exemplary DAC are shown, wherein the broken lines indicate the original output impedance curve without compensation L1, and the solid line indicates the output impedance curve with compensation L2 of the present invention. Comparing the output impedance curve without compensation L1 with a first ideal linear line L1', it is noted that the difference between the linearity of the output impedance curve without compensation L1 and the first ideal linear line L1' is very obvious especially when the input code is about at the middle value, i.e. 2048. The linearity of the output impedance curve without compensation L1 is not good.

By adding the compensation unit 104 that provides a small impedance corresponding to the middle input code as shown in FIG. 5, the output impedance curve with compensation L2 will be more closer to a second ideal linear line L2'. The difference between the output impedance curve with compensation L2 and the second ideal linear line L2' is reduced. The v-shaped impedance curve of the PMOS can improve the original output impedance of the DAC and accordingly make the curve of the compensated output impedance have superior linearity.

Figure 7A:
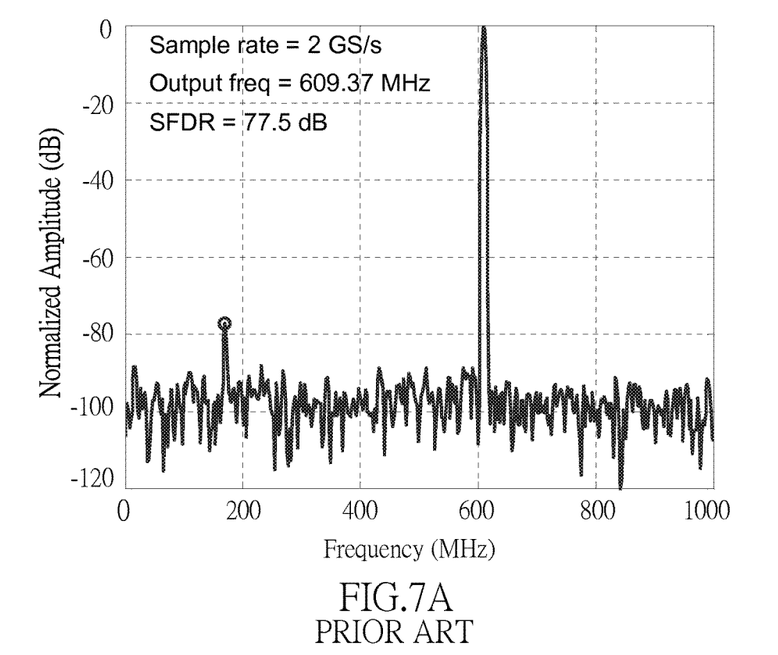
FIGS. 7A and 7B respectively show SPICE-simulated output spectrums of the 12-bit exemplary DAC without and with the compensation unit of FIG. 5.
Figure 7B:
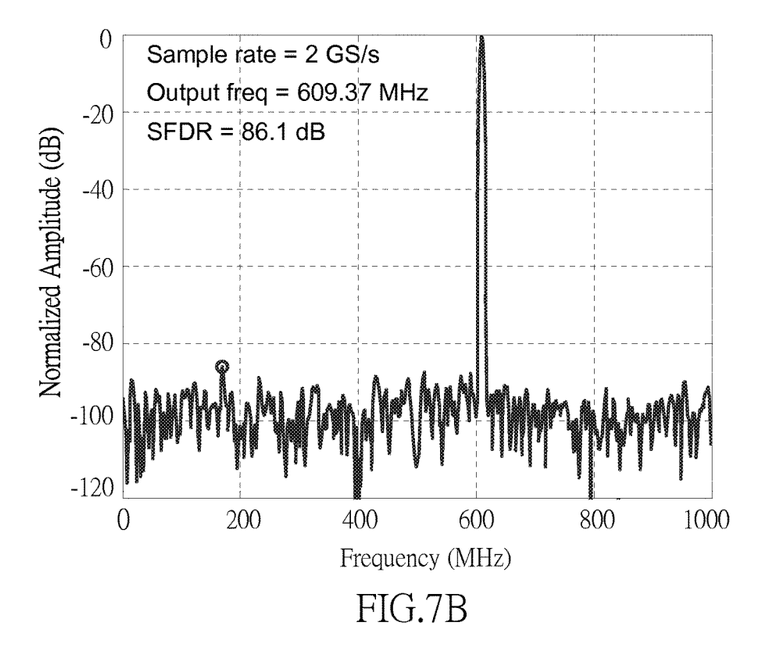

With reference to FIGS. 7A and 7B, two output spectrums of the 12-bit exemplary DAC are generated by Simulation Program with Integrated Circuit Emphasis (SPICE) software. FIG. 7A shows the output spectrum without output impedance compensation. FIG. 7B shows the output spectrum with output impedance compensation of the present invention. The harmonic distortion is reduced by the impedance compensation. The sample rate of the DAC is 2 GS/s, the output frequency is 609.37 MHz, and the SFDR performance is improved from 77.5 dB to 86.1 dB.

Figure 8:
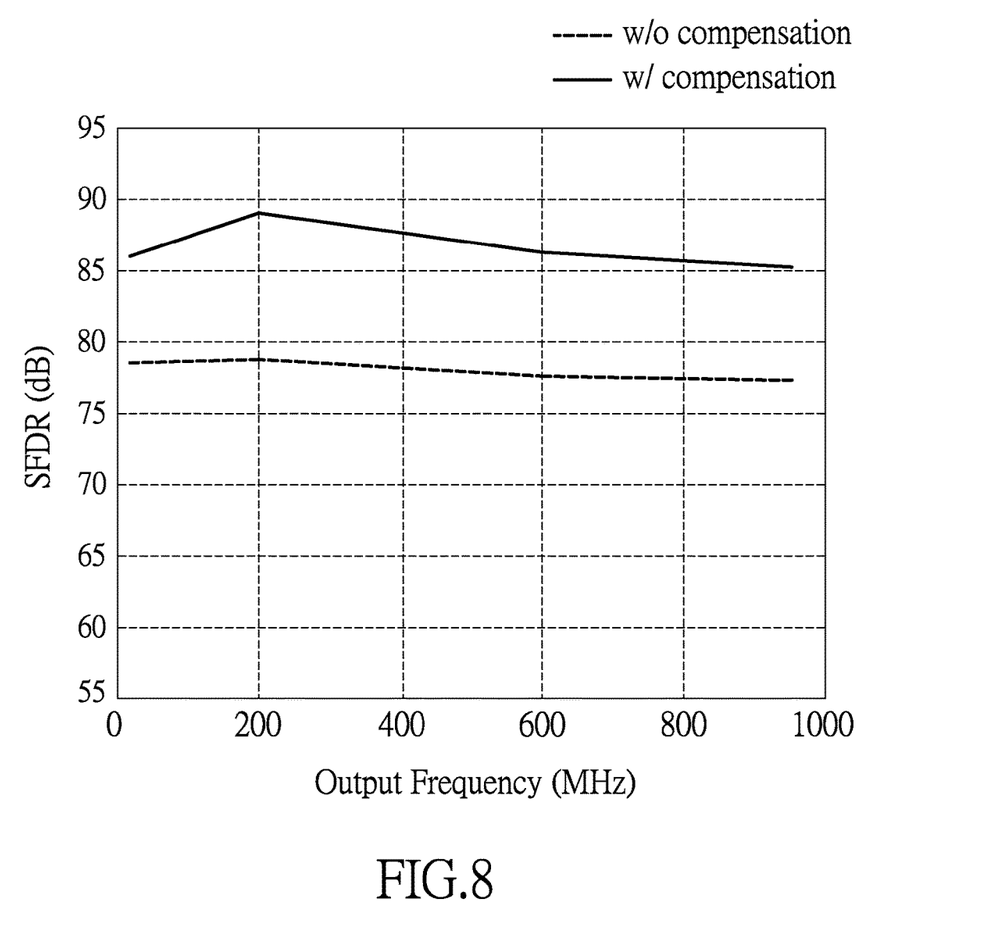
FIG. 8 shows the SPICE-simulated SFDR curves of the 12-bit exemplary DAC without and with output impedance compensation.

With reference to FIG. 8, the SPICE-simulated SFDR curves without and with the output impedance are shown. The broken lines indicate the original SFDR without compensation, and the solid line indicates the SFDR with compensation of the present invention. The compensation unit 104 can improve more than 8 dB for SFDR performance at any output frequencies.

Figure 9:
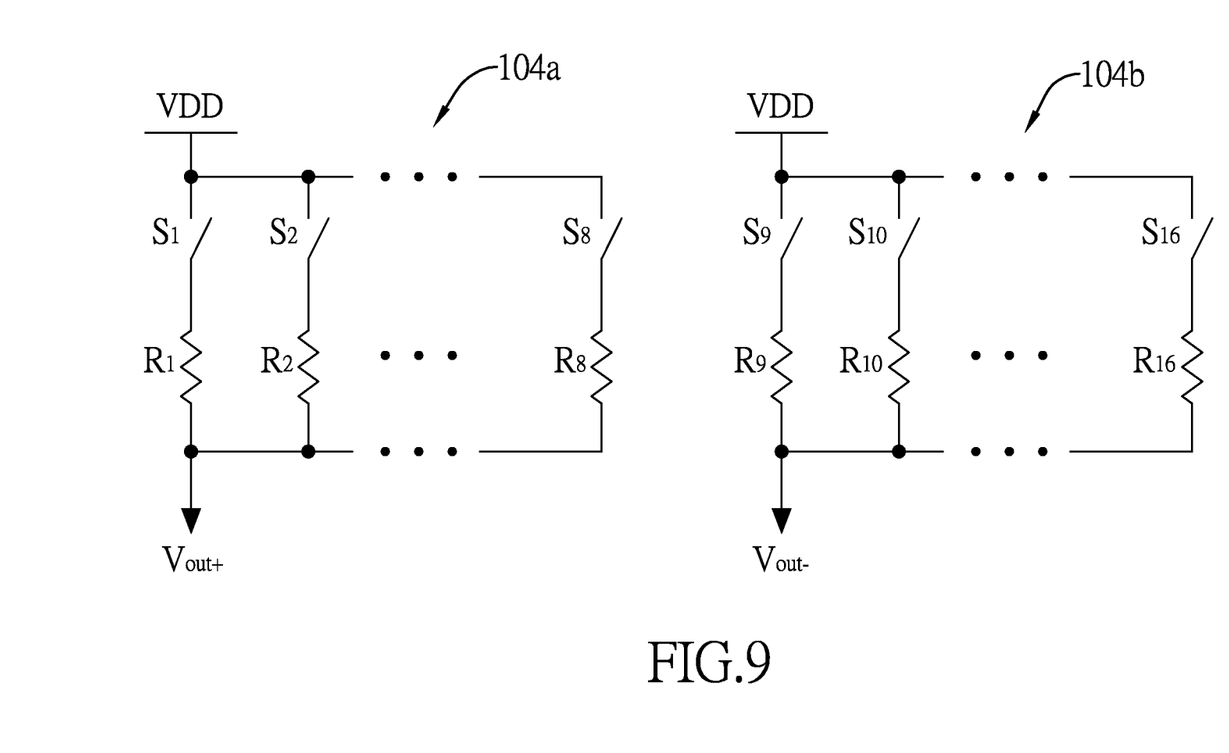
FIG. 9 is a circuit diagram showing the compensation unit implemented by two compensation circuits of the present invention.

With reference to FIG. 9, the compensation unit 104 in accordance with a second embodiment is implemented by two compensation circuits 104a, 104b for connecting to the differential output terminals $V_{out+}$, $V_{out-}$ of the DAC respectively. Each compensation circuit 104a, 104b comprises multiple selectable resistors R1 to R8, R9 to R16 connected in parallel, wherein each selectable resistor is connected with a respective controllable switch S1 to S8, S9 to S16 in series. The resistors R1-R8 of the same compensation circuit 104a have different resistances. The controllable switches S1 to S8, S9 to S16 are selected and turned on depending on the received binary-weighted digital inputs $B_N$ to $B_1$ For a DAC with a single-end output terminal, a single compensation circuit 104a can be connected to the output terminal DAC as the compensation unit 104.

With reference to the following table for a 12-bit DAC with two differential output terminals, relationships between the received binary-weighted digital inputs $B_N$ to $B_1$ and the selected resistors are shown. The binary-weighted digital inputs $B_N$ to $B_1$ are represented in decimal values 0 to 4095 of an input data range. For example, if the binary-weighted digital inputs $B_N$ to $B_1$ correspond to any one of the decimal values 0 to 255, the corresponding controllable switches S1 and S9 of the two compensation circuits 104a, 104b will be turned on to select the resistors R1 and R9. Preferably, both of the selected resistors in the two compensation circuits 104a, 104b have the same resistance, i.e. R1=R9, R2=R10, R3=R11, R4=R12, R5=R13, R6=R14, R7=R15, and R8=R16.

| Input code (decimal value) | Turn-on switches | Selected resistors |
|---|---|---|
| 0-255, 3840-4095 | S1, S9 | R1, R9 |
| 256-511, 3584-3839 | S2, S10 | R2, R10 |
| 512-767, 3328-3583 | S3, S11 | R3, R11 |
| 768-1023, 3072-3327 | S4, S12 | R4, R12 |
| 1024-1279, 2816-3071 | S5, S13 | R5, R13 |
| 1280-1535, 2560-2815 | S6, S14 | R6, R14 |
| 1536-1791, 2304-2559 | S7, S15 | R7, R15 |
| 1792-2047, 2048-2303 | S8, S16 | R8, R16 |

Figure 10:
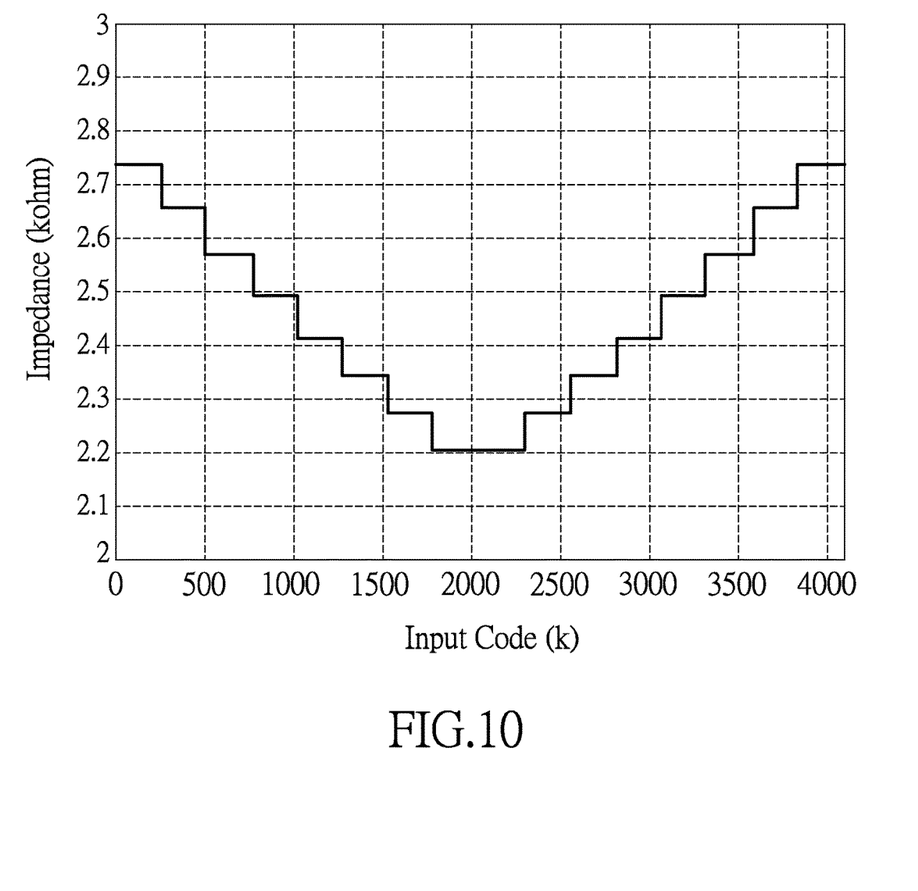
FIG. 10 shows an impedance curve of the two compensation circuits of FIG. 9.

With reference to FIG. 10, the impedance curve of the two compensation circuits 104a, 104b is formed by different impedance values contributed by the resistors R1 to R16. The impedance curve has a highest impedance value corresponding to a lowest input value and a highest input value of the input data range, and has a lowest impedance value corresponding to a middle input value of the input data range. Therefore, the impedance curve of is substantially and symmetrically v-shaped.

Figure 11A:
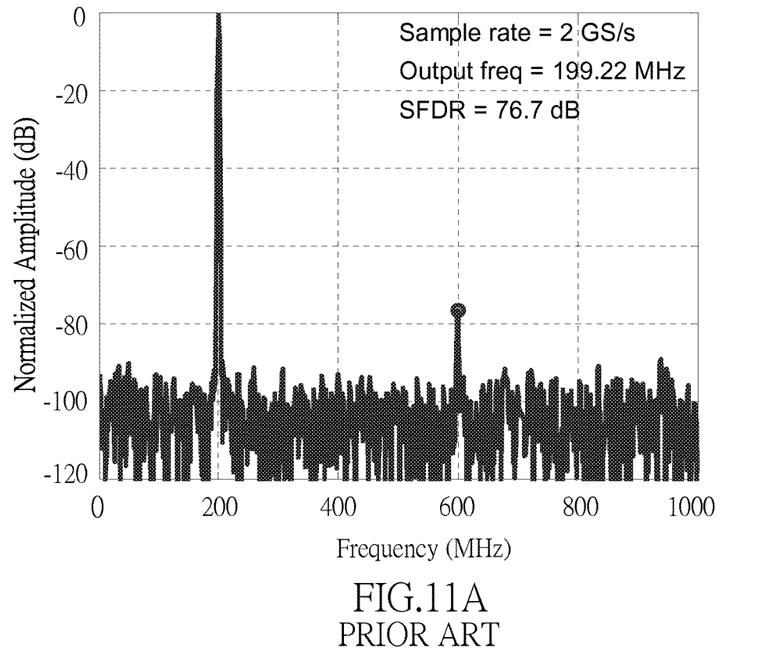
FIGS. 11A and 11B respectively show SPICE-simulated output spectrums of the 12-bit exemplary DAC without and with the compensation unit of FIG. 9.
Figure 11B:
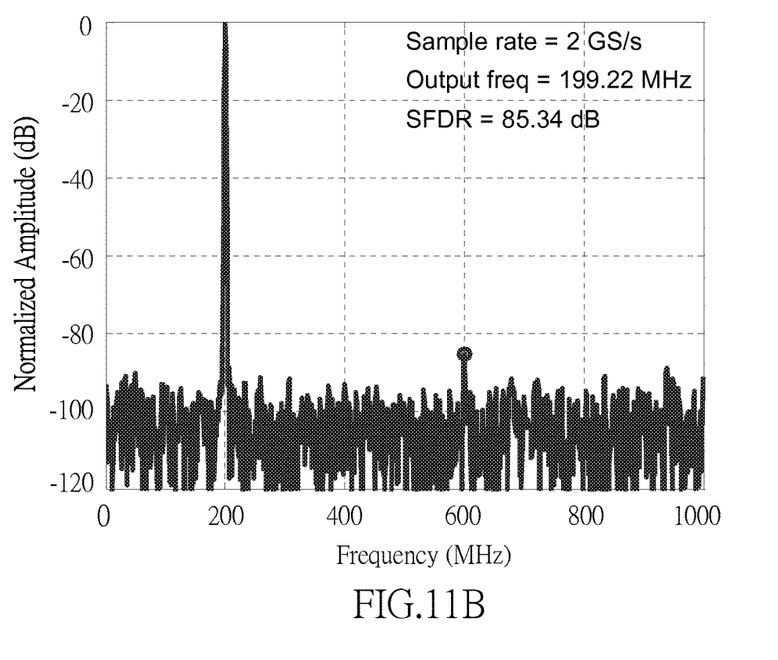

With reference to FIGS. 11A and 11B, two output spectrums of the 12-bit exemplary DAC are generated by SPICE software. FIG. 11A shows the output spectrum without output impedance compensation. FIG. 11B shows the output spectrum with output impedance compensation of the present invention. The harmonic distortion is reduced by the impedance compensation. The sample rate of the DAC is 2 GS/s, the output frequency is about 200 MHz, and the SFDR performance can be improved from 76.7 dB to 85.3 dB.

Figure 12:
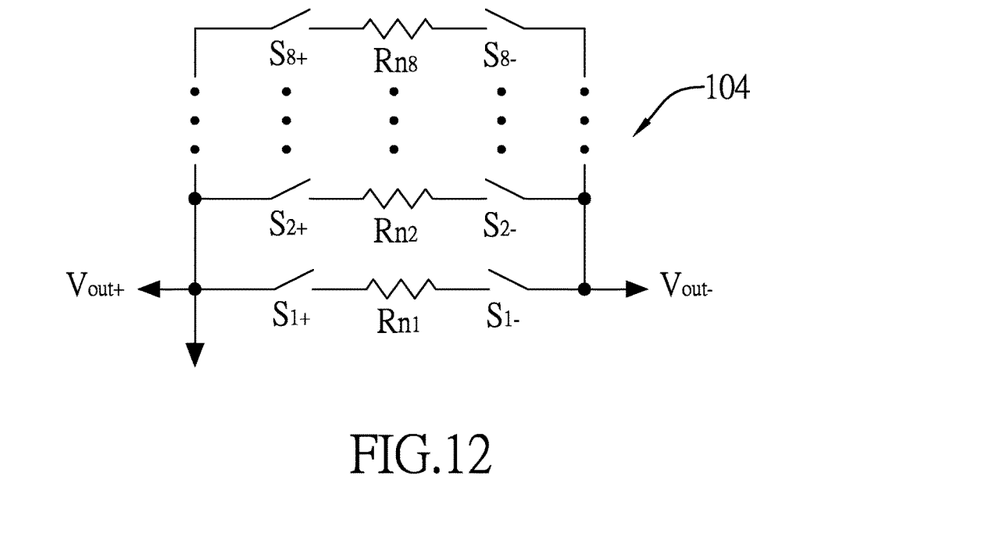
FIG. 12 is a circuit diagram showing a third embodiment of the compensation unit of the present invention.

With reference to FIG. 12, a third embodiment of the compensation unit 104 is connected between the differential output terminals $V_{out+}$, $V_{out-}$ of the DAC respectively. The compensation unit 104 comprises multiple selectable resistor unit $R_{n1}$ to $R_{n8}$ connected in parallel, wherein each selectable resistor unit $R_{n1}$ to $R_{n8}$ is connected to two respective controllable switches $S_{1+}$ to $S_{8+}$, $S_{1-}$ to $S_{8-}$ in series. The resistor units $R_{n1}$-$R_{n8}$ have different resistances. If the $R_{n1}=2\times R_1=2\times R_9$ and so on, the compensation unit 104 will have the same output impedance curve as shown in FIG. 10.

With reference to the following table for a 12-bit DAC with two differential output terminals, relationships between the received binary-weighted digital inputs $B_N$ to $B_1$ and the selected resistors are shown.

| Input code (decimal value) | Turn-on switches | Selected resistors |
|---|---|---|
| 0-255, 3840-4095 | $S_{1+}$, $S_{1-}$ | $R_{n1}$ |
| 256-511, 3584-3839 | $S_{2+}$, $S_{2-}$ | $R_{n2}$ |
| 512-767, 3328-3583 | $S_{3+}$, $S_{3-}$ | $R_{n3}$ |
| 768-1023, 3072-3327 | $S_{4+}$, $S_{4-}$ | $R_{n4}$ |
| 1024-1279, 2816-3071 | $S_{5+}$, $S_{5-}$ | $R_{n5}$ |
| 1280-1535, 2560-2815 | $S_{6+}$, $S_{6-}$ | $R_{n6}$ |
| 1536-1791, 2304-2559 | $S_{7+}$, $S_{7-}$ | $R_{n7}$ |
| 1792-2047, 2048-2303 | $S_{8+}$, $S_{8-}$ | $R_{n8}$ |

By adding a nonlinear impedance compensation unit 104 at the output terminals of the DAC, the compensated output impedance of the DAC will have superior linearity and the SFDR performance of the DAC is improved. Further, because the output impedance of the DAC is improved by connecting a relative simple compensation unit 104 at the output terminal instead of modifying the structures of the current cells $U_j$, the fabricating cost of the DAC is relative low. With the simple structure, the compensation unit 104 is suitable to be applied to high-speed DACs.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A digital to analog converter (DAC) with output impedance compensation, the DAC comprising:
    an encoding unit receiving and encoding a plurality of binary-weighted digital inputs to generate a plurality of encoded controlling signals;
    a current cell array comprising a plurality of conversion units that respectively receive the encoded controlling signals to generate analog output signals;
    a summing unit receiving the analog output signals from the current cell array and summing the analog output signals to generate an accumulated analog output signal; and
    a compensation unit providing a nonlinear impedance to compensate an output impedance seen from the current cell array and the summing unit of the DAC;
    wherein the plurality of binary-weighted digital inputs is capable of expressing an input data range; and
    an impedance curve of the nonlinear impedance provided by the compensation unit has
    a highest impedance value corresponding to a lowest input value and a highest input value of the input data range; and
    a lowest impedance value corresponding to a middle input value of the input data range.

2. The DAC as claimed in claim 1, wherein the DAC has two differential output terminals at which the current cell array and the summing unit are connected together, and the compensation unit is connected between the differential output terminals to compensate the output impedance of the DAC.

3. The DAC as claimed in claim 2, wherein the compensation unit is a PMOS transistor operated in a linear region and having a source, a drain and a gate, wherein the drain and the source of the PMOS transistor are respectively connected to the two differential output terminals, and the gate is grounded.

4. The DAC as claimed in claim 2, wherein the compensation unit comprises two separate compensation circuits respectively connected to the differential output terminals.

5. The DAC as claimed in claim 4, wherein each of the compensation circuits comprises multiple resistors connected in parallel and each resistor is connected with a controllable switch in series, wherein the resistors of the same compensation circuit have different resistances.

6. The DAC as claimed in claim 5, wherein the controllable switches are selectively turned on according to the binary-weighted digital inputs.

7. The DAC as claimed in claim 2, wherein the compensation unit comprises multiple resistor units connected in parallel and each resistor unit is connected with two controllable switches in series, wherein the resistor units have different resistances.

8. The DAC as claimed in claim 1, wherein the DAC has a single-end output terminal, and the compensation unit is connected to the single-end output terminal to compensate the output impedance of the DAC.

9. The DAC as claimed in claim 8, wherein the compensation unit comprises multiple resistors connected in parallel, and each resistor is connected with a controllable switch in series, wherein the resistors have different resistances.

10. The DAC as claimed in claim 9, wherein the controllable switches are selectively turned on according to the binary-weighted digital inputs.

11. The DAC as claimed in claim 2, wherein each conversion unit comprises a current source and a pair of current switches.

12. The DAC as claimed in claim 4, wherein each conversion unit comprises a current source and a pair of current switches.

13. The DAC as claimed in claim 8, wherein each conversion unit comprises a current source and a pair of current switches.

* * * * *